US000001458H

United States Statutory Invention Registration [19]

[11] Reg. Number: H1458

Slack

[43] Published: Jul. 4, 1995

[54] SIGNAL AMPLITUDE DISTRIBUTION ANALYZER

[75] Inventor: Robert A. Slack, San Diego, Calif.

[73] Assignee: The United States of America as represented by the Secretary of the Navy, Washington, D.C.

[21] Appl. No.: 83,962

[22] Filed: Jun. 23, 1993

[51] Int. Cl.[6] ..... G01R 19/00

[52] U.S. Cl. ..... 324/76.13; 327/51

[58] Field of Search ..... 364/554, 553; 307/360, 307/361; 324/76.13

[56] References Cited

U.S. PATENT DOCUMENTS

| | | | |
|---|---|---|---|
| 2,905,888 | 4/1957 | Carney . | |
| 3,497,684 | 6/1967 | McKiernan . | |
| 3,581,200 | 5/1971 | Mifflin . | |
| 3,626,168 | 12/1971 | Norsworthy . | |
| 3,665,505 | 5/1972 | Euer | 324/76.13 |
| 3,742,352 | 6/1973 | Euer | 324/76.13 |
| 4,129,827 | 12/1978 | Southwick . | |
| 4,342,965 | 8/1982 | Baldwin | 307/360 |
| 4,528,591 | 7/1985 | Liepe | 307/360 |
| 4,625,283 | 11/1986 | Hurley . | |
| 4,985,844 | 1/1991 | Foley et al. . | |
| 5,003,248 | 3/1991 | Johnson . | |

OTHER PUBLICATIONS

S. R. Michaels, "Test Whether a Noise Source is Gaussian", *EDN*, 11 Dec. 1986, pp. 272–274.

*Primary Examiner*—Gregory: Bernarr E.

*Attorney, Agent, or Firm*—Harvey Fendelman; Thomas Glenn Keough; Peter A. Lipovsky

[57] ABSTRACT

A signal amplitude distribution analyzer measures the amplitude probability density function of electrical signals, and in particular, the amplitude probability distribution of noise signals. Such measurements may be used to determine the "Gaussianicity" of noise signals, that is, a measurement of how closely the amplitude distribution of noise signals corresponds to theoretical values derived from the Gaussian probability distribution density function. This theoretical density function represents the relative percentage of time that a noise signal is at a given amplitude. The invention gives an approximation of this function by measuring the amount of time a noise signal is between a window of two adjustable voltage levels. This is accomplished by producing an output voltage proportional to the amount of time a noise signal amplitude falls within the window of values defined by the two adjustable voltage levels. The center point of this window is then plotted versus the invention's output voltage, giving the amplitude distribution density. This is then compared to the theoretical density function, plotted on the same graph, to determine signal "Gaussianicity." The invention is calibrated to give an output that is Gaussian when analyzing a known Gaussian input. A continuous resolution measurement of the signal amplitude probability density function is possible, permitting accurate analysis of noise statistics in terms of skewness, clipping, etc. The cumulative amplitude distribution of noise signals can also be measured by the analyzer of the invention.

10 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SIGNAL AMPLITUDE DISTRIBUTION ANALYZER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

1. Field of the Invention

This invention relates generally to the field of signal analyzers and, more particularly, to a signal analyzer designed to measure the amplitude probability distribution of electrical signals. In greater particularity, the invention relates to a signal analyzer designed to measure the amplitude probability density function of noise signals to allow characterization of the signal's statistics in terms of skewness, clipping, kurtosis and other non-Gaussian deviations.

2. Description of the Related Art

In the past, the Gaussianicity of noise signals was estimated by measuring the signal's cumulative amplitude distribution. This measurement was done through repetitive sampling of signal amplitude in combination with computer analysis, or by a simple comparator circuit such as that described on pages 272–274 of the Dec. 11, 1986 EDN magazine article titled, "Test whether a noise source is Gaussian."

The cumulative amplitude distribution function gives the probability that a variable will assume a value equal to or greater than a particular value over a range of values. By the cumulative amplitude distribution method, the relative Gaussianicity of noise signals is determined by the degree of conformance of measured data to a theoretical cumulative distribution curve.

A limitation of the cumulative amplitude distribution method is that measured data do not show the actual distribution of amplitudes. Because of this, departures of data from the theoretical curve do not characterize precisely how a noise signal is different from true Gaussian noise. As will be visually depicted in this disclosure, this method indicates non-Gaussianicity only by a departure of the signal's plotted distribution from the theoretical cumulative amplitude distribution curve. Abnormal characteristics of the noise signal such as skewness, kurtosis, clipping and other non-Gaussian deviations cannot be readily identified.

The cumulative amplitude distribution method can also be relatively insensitive and give results that are difficult to relate to in Gaussian terms, thereby making it difficult to judge the overall degree of non-Gaussianicity of noise signals.

Another probability distribution is the amplitude probability density distribution. This distribution gives the probability that a variable will assume a value near any particular value in its range of values.

Techniques exist for calculating amplitude probability density distributions. One such technique is described in U.S. Pat. No. 3,626,168 issued to Keith H. Norsworthy. This patent describes an invention capable of a multitude of signal measurements. For measurements of amplitude probability density distribution, this invention outputs an indicating signal when an input signal falls between two known signal levels. The indicating signal is then apparently sent to an averaging bin to provide a digitally constructed density distribution.

The '168 patent describes an invention that is highly complex and because of the use of a finite number of averaging bins, it cannot provide continuous resolution capability.

In a second scheme, the amplitude probability density distribution is determined through an invention described in U.S. Pat. No. 3,581,200. This invention produces a probability density function profile through the use of a wave generator, spectrum analyzer, sweep generator and x–y recorder. The '200 invention converts signal amplitude distributions into a frequency domain profile for visualization by way of the spectrum analyzer. The invention is of relative high complexity, and nature of the design appears to make system calibration difficult.

In a related but different area, the invention of U.S. Pat. No. 4,625,283 issued to James R. Hurley describes an invention designed to analyze repetitive signals, e.g. sinewave signals. This invention measures the elapsed times it takes for an alternating current signal to cross predetermined reference values and compares these with known values to determine characteristics of an alternating current signal being analyzed. Signal characteristics such as frequency, size of direct current offset and waveform amplitude apparently can be determined with this invention.

A need thus exists for a simple, calibrated device that permits continuous resolution of signal amplitude probability distribution. Such an invention should be able to readily permit the perception of noise signal skewness, kurtosis, clipping, as well as other non-Gaussian deviations.

SUMMARY OF THE INVENTION

The signal amplitude distribution analyzer of the invention is designed to measure the amplitude probability density function of electrical signals. This invention has been particularly devised to measure the amplitude probability distribution of noise signals. Such measurements may be used to determine the "Gaussianicity" of noise signals, that is, a measurement of how closely the amplitude density distribution of noise signals corresponds to theoretical values derived from the Gaussian probability density distribution function (i.e. a normal distribution curve). This theoretical density function represents the relative percentage of time that a noise signal is at a given amplitude. The invention gives an approximation of this function by measuring the amount of time a noise signal is between a window of two adjustable voltage levels. This is accomplished by producing an output voltage proportional to the amount of time a noise signal amplitude falls within the window of values defined by the two adjustable voltage levels. Both repetitive and non-repetitive signals may be measured.

The center point of the window is then plotted versus the invention's output voltage, giving the amplitude distribution density. This is then compared to the theoretical density function, plotted on the same graph, to determine signal "Gaussianicity." The invention is calibrated to give an output that is Gaussian when analyzing a known Gaussian input. A continuous resolution measurement of the signal amplitude probability density function is possible, permitting accurate analysis of noise statistics in terms of skewness, clipping, etc. The cumulative amplitude distribution of noise signals can also be measured.

OBJECTS OF THE INVENTION

It is an object of this invention is to provide an improved signal analyzer.

Another object of this invention is to provide an improved signal analyzer that is simple in operation.

Yet another object of this invention is to provide an improved signal analyzer that is capable of continuous resolution.

A further object of this invention is to provide an improved signal analyzer that may be easily calibrated so as to provide a quantitative measurement.

Still a further object of this invention is to provide an improved signal analyzer that measures amplitude probability density functions/probability density distributions.

Other objects, advantages and new features of the invention will become apparent from the following detailed description of the invention when considered in conjunction with the accompanied drawings.

DESCRIPTION OF THE PREFERRED EMBODIMENT

Figure 1:
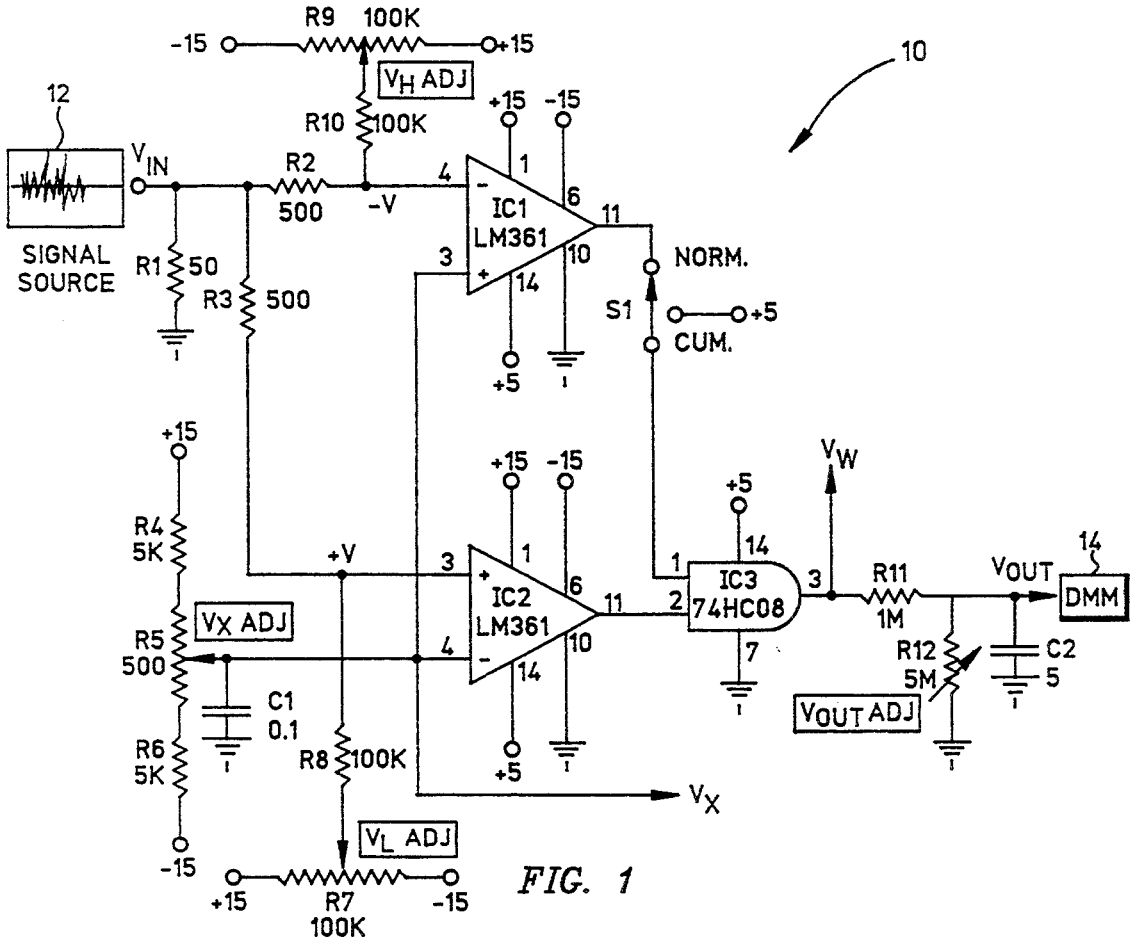
FIG. 1 is a schematic of a representative embodiment of the signal amplitude distribution analyzer of the invention.

Referring now to FIG. 1 a schematic diagram of signal amplitude distribution analyzer 10 is shown. In the representative embodiment of the invention shown, all resistors are in ohms and capacitors are in microfarads ($\mu$F). All 3 integrated circuit (IC) power connections are decoupled by 100 ohm, and 0.1 $\mu$F filter networks. In FIG. 1 resistor R1 provides a 50-ohm termination for signal source 12 being tested. The source is fed as an input signal, $V_{in}$, that is then connected to an inverting input of integrated circuit 1 (ICl), pin 4, and the non-inverting input of IC2 (pin 3) through isolating resistors R2 and R3, respectively. Integrated circuits IC1 and IC2 are high speed comparators such as LM361s. The reference voltage for IC1 and IC2, $V_x$, about which a noise signal is analyzed, is set by resistors R4, R5 and R6, and is applied to pins 3 and 4 of IC1 and IC2, respectively. Capacitor C1 provides filtering so that $V_x$ remains at the voltage set by R5 in spite of any feedback of comparator switching transients. The other inputs to IC1 and IC2 are variable voltages that compensate for IC offset voltages and currents, and also set comparator thresholds. The voltage ($V_H$) at pin 4 of ICl is primarily determined by a voltage divider including R9, R10, R2, R1 and the signal source resistance. The voltage ($V_L$) at pin 3 of IC2 is developed similarly by R7, R8, R3, R1 and the signal source resistance.

Figure 2:
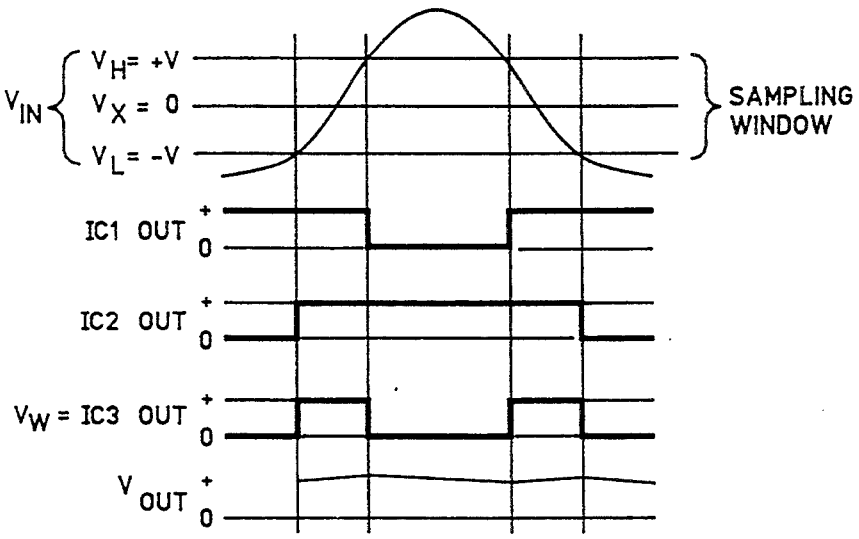
FIG. 2 depicts waveforms useful in describing the calibration procedure of the invention.

Referring now to FIGS. 1 and 2, the voltage at pin 4 of IC1 ($V_H$) is normally set to some small negative voltage and that at pin 3 of IC2 ($V_L$) to a small positive voltage creating a preselected "window" of voltage levels. With $V_x$ set for 0 volts DC (VDC), then, when $V_{in}$ is very negative, IC1 output will be high (positive) and IC2 will be low (nominally zero volts). IC1 and IC2 outputs are applied to pins 1 and 2 of an AND gate IC3, such as a 74HC08, the output at pin 3 of which will thus be low. When $V_{in}$ rises to a negative voltage slightly smaller than the positive bias at pin 3 of IC2, pin 3 becomes positive with respect to pin 4 and IC2 goes high. Both inputs to IC3 are then high, producing a high output. As $V_{in}$ continues to rise, however, it will become positive enough to overcome the negative bias at pin 4 of IC1. When this occurs, pin 4 will become positive with respect to pin 3, and IC1 output will go low. This in turn will cause AND gate output (pin 3 of IC3) to go low.

The AND gate output (pin 3 of IC3) is thus high only when $V_{in}$ is between the range between the small negative voltage and the small positive voltage. At all other times the AND gate output is low. The "window" of $V_{in}$ voltages that produces a high output is determined by the bias voltages set at pin 4 of IC1 by R9, and at pin 3 of IC2 by R7. It should be noted that when $V_{in}$ decreases, the same result occurs. That is, when $V_{in}$ goes below the window upper level (i.e. to some small positive voltage), pin 4 of IC1 will become more negative than pin 3, giving a high output at IC1, and at IC3. But when $V_{in}$ drops below the window lower level (i.e. beyond a small negative voltage), pin 3 of IC2 will go negative, producing a low IC2 and IC3 output. The output of AND gate IC3 is thus positive only when $V_{in}$ transitions through the window of voltages set by R7 and R9.

The output of IC3 is voltage divided by Rll and potentiometer R12, and filtered by capacitor C2. Output voltage, $V_{out}$ is then applied to a digital multimeter (DMM) 14. DMM 14 effectively integrates the filtered output pulses from pin 3 of IC3. As explained above, IC3 will produce pulse lengths equal to the amount of time that $V_{in}$ is within the preset window voltage range. DMM 14, therefore, reads a voltage that is proportional to the amount of time $V_{in}$ is within this window. Put another way, the DMM indicates the relative amount of time that an input signal is at a given input level range.

By setting R5 to make $V_x$ some positive or negative value, the window will simply be raised or lowered. The window voltage range (i.e. the difference between the window lower and upper voltage levels) remains constant. Therefore, R5 can be set for different values of $V_x$, and DMM 14 will indicate the relative amount of time that the signal spends at these levels. In practice, the window lower voltage, $V_L$, and higher voltage, $V_H$, are set symmetrically about $V_x$. The digital multimeter therefore indicates the relative amount of time that $V_{in}$ equals $V_x$, where $V_x$ is approximated by a window of voltages between $V_L$ and $V_H$.

Figure 3:
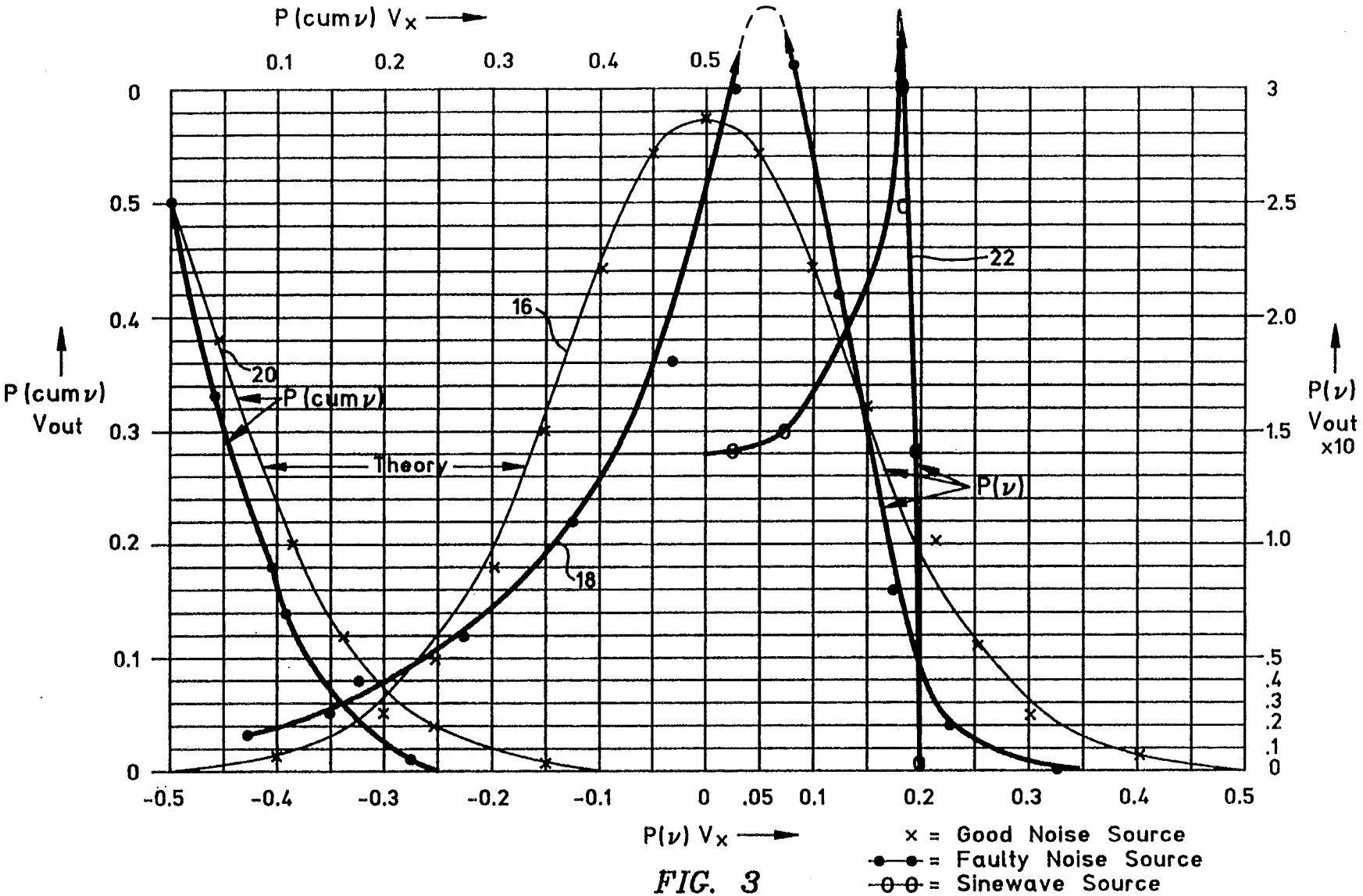
In FIG. 3 there are plotted outputs of the invention as compared to a theoretically derived signal amplitude probability density distribution and a cumulative amplitude distribution.

This relationship is exactly what is given by theoretical probability density functions. That is, for Gaussian noise, the amplitude probability density function is:

$$P(v) = \frac{1}{s\sqrt{2\pi}} e^{-\frac{v^2}{2s^2}}$$

where v is the instantaneous voltage amplitude and s is the root mean square (rms) voltage level. This relationship is plotted on FIG. 3 for a value of s=140 mv rms, see plot 16. The 140 mv rms value of s is a relatively arbitrary level, chosen in this case to be small enough for noise sources that were actually tested, but high enough to be relatively insensitive to circuit fluctuations. The right hand ordinate of FIG. 3 is labeled as "$V_{out} \times 10$" since in this representative embodiment, the invention is normally calibrated by R12 to give a DMM reading of 0.286 VDC with the 140 mv rms noise voltage in, with $V_x$ set to 0 VDC. This makes measurements easily related to the theoretical curve 16 (i.e. DMM reading times 10), while not requiring an additional amplifier with a gain of 10.

In practice the invention is easily calibrated by applying a sinewave at a frequency of about 4 kHz to the $V_{in}$ input, and setting $V_x$ equal to 0 VDC. The input signal, $V_{in}$, and the output pulses at pin 3 of IC3, $V_W$, are simultaneously viewed on an instrument such as a dual trace oscilloscope. Potentiometer R7 is then set so that the $V_W$ pulses rise when $V_{in}$ is at a $-V_L$ level, and R9 is set so that the trailing edge of $V_W$ occurs when $V_{in}$ is at a $V_H$ level. This defines the sampling window as $V_H-V_L$, with $V_x=0$ VDC as the average value. Resistor R12 is then adjusted, as noted above, for 0.286 VDC output with 140 mv rms of noise in. The area under the P(v) curve of FIG. 3 between any two values of $V_x$ represents the relative probability (or amount of time) that a signal voltage is within the windowed voltage range. Therefore, for greatest accuracy, the measurement window range should be as small as possible. However, very small window ranges can produce very low output voltages as well as high sensitivities to circuit imperfections. For practical purposes, therefore, with $V_x=0$ V, $V_L$ can be set for $-25$ mv and $V_H$ can be set for $+25$ mv, giving a 50 mv window range. This value has given adequate accuracy for a number of commercial noise sources tested.

Once the invention has been calibrated as described above, measurements can be done as follows. First, the noise source to be tested, signal source 12, is connected to analyzer 10's $V_{in}$ input. The output of the noise source is adjusted for an amplitude of 140 mv rms, as read on a true rms voltmeter. The value of $V_x$ is then varied over the range, for example, $-0.5$ to $+0.5$ VDC, and $V_{out}\times 10$ is recorded for each value of $V_x$ tested. By closely spacing the values of $V_x$ continuous measurement resolution is possible. These measurements are plotted on a graph such as FIG. 3 so that measured curves can be directly compared to theoretical curve 16 for P(v). FIG. 3 shows examples of such test data. As can be seen, the measured values for a good noise source (shown as "X's) fall very closely to theoretical curve 16. However, the curve for a noise source known to be faulty (plotted with dots) shows a marked deviation from Gaussian theory. This curve (18), indicates that the noise signal contains inordinately high negative peaks, positive peak clipping, and a positively skewed, leptokurtic distribution. All of these non-Gaussian characteristics could be cross-correlated with an oscilloscope display of the signal. It should be noted that none of these characteristics would be readily visible from a cumulative amplitude distribution of the faulty noise source.

As earlier discussed, the signal amplitude distribution analyzer of the invention can also be used to measure cumulative amplitude distribution. This is done by setting switch S1 to the CUM position, thereby disconnecting the output from IC1 and connecting the pin 1 AND input of IC3 to a high level of $+5$ VDC. This in effect makes IC3 just a buffer stage whose output is the same as the input of its pin 2. The circuit is then recalibrated by first terminating the $V_{in}$ input in 50 ohms (no signal), setting $V_x$ to some negative value, and setting R12 for a 1 VDC DMM reading. Since IC2 and IC3 are both continuously high under these conditions, simulating the case where $V_{in}$ is always greater than 0 V, the 1 VDC DMM reading is set to indicate a 100% cumulative distribution value. Next, with a noise source having an amplitude of 140 mv rms connected to the $V_{in}$ input, and with $V_x$ set for 0 VDC, R7 is set for a 0.5 VDC reading on the DMM. In this case, R7 acts only as an offset nulling adjustment for IC2, and the DMM reading indicates that the signal is above 0 VDC 50% of the time, as it should with $V_x=0$ VDC.

Once calibrated, cumulative distribution measurement is made in the same way as for other distribution measurements. The value of $V_x$ is varied over a selected range such as 0 to $+0.5$ VDC and the cumulative distribution is read on the DMM for a number of $V_x$ values. The recorded values of $V_x$ and $V_{out}$ (the left hand ordinate of FIG. 3) are then co-plotted with the theoretical Gaussian cumulative distribution curve 20 as shown on the left of FIG. 3. In this case theoretical curve 20 is defined by P(cum v), which is the integral of the distribution function from $V_x$ to infinity. The P(cum v) theoretical curve 20 can also be computed using available tables and the formula:

$$P(cum\ v) = \frac{1}{2}\ erfc\frac{|v|}{s\sqrt{2}}$$

where "erfc" is the complementary error function.

FIG. 3, in addition to showing distribution density function profiles, also shows cumulative distribution data obtained from the same noise sources tested for the distribution density function. Note that the good noise source (plotted as "X"s) produces test data points that lie closely to theoretical curve 20. The faulty noise source data (shown as dots), on the other hand, departs from theoretical curve 20. However, unlike the data from distribution density function testing, little indication is given as to the degree or character of this departure from Gaussianicity.

FIG. 3 provides a direct comparison of results from cumulative and distribution density function testing. It shows how much more revealing it is to measure the distribution density function itself, rather than to measure cumulative distribution, as is typically done. FIG. 3 also shows the measured amplitude distribution of a sinewave (22) for positive values of $V_x$. This demonstrates that the signal amplitude distribution analyzer of the invention can be used to make amplitude distribution measurements of any waveform type whether they be repetitive or non-repetitive.

The advantages of the signal amplitude distribution analyzer of the invention over older methods of measuring signal amplitude distribution are many. The invention gives the capability of measuring probability density function itself rather than cumulative distribution functions, providing a more sensitive measure as to the degree of conformance of a noise source with theory. The invention is therefore capable of characterizing deviations from theory rather than only indicating a degree of nonconformance.

As the invention is easily calibrated from a known input source, precise measurement of a signal source's deviations is possible. These sources may be of a repetitive or non-repetitive type, with the invention providing a continuous, overlapping, resolution to enhance measurement accuracy. The invention provides not only a mechanism to sense the presence of sought-after signals, but also provides the relative amount of time that an input signal is within a selected signal range. This latter relationship is exactly what is given by theoretical probability density functions.

It should be noted that the signal amplitude distribution analyzer of the invention uses a very simple implementation scheme, requiring only three integrated circuit components. Of course the invention could be made more accurate by using more complex circuitry. It also could be improved by using an analog-to-digital converter, computer interface circuits and computer analysis. The invention could also be expanded to provide automatic threshold or window stepping, so that results could be printed automatically on an X/Y recorder.

Obviously, many modifications and variations of the invention are possible in light of the above teachings. It is therefore to be understood that within the scope of the appended claims the invention may be practiced otherwise than as has been specifically described.

What is claimed is:

1. An apparatus for analyzing signals comprising:

a first comparator for comparing voltage of said signals to a preselected lower voltage and for providing an output signal when the voltage of said signals is above said preselected lower voltage;

a second comparator for comparing voltage of said signals to a preselected higher voltage and for providing an output signal when the voltage of said signals is below said preselected higher voltage; and an AND circuit coupled to said first and second comparators for providing a pulse upon simultaneously receiving said output signals from said comparators, said pulse having a pulse length corresponding to the elapsed time said signals are within a voltage window bounded by said lower and higher voltages.

2. An apparatus according to claim 1 further including:

an integrator coupled to said AND circuit for integrating said pulse provided by said AND circuit to provide a voltage proportional to said elapsed time said signals are within said voltage window.

3. An apparatus according to claim 2 in which said integrator is a voltmeter.

4. An apparatus according to claim 1 in which said apparatus is calibrated by analyzing a known input signal.

5. An apparatus according to claim 4 in which said known input signal is a Gaussian signal.

6. A method for approximating the amplitude probability density distribution of signals comprising the steps of:

comparing voltage of said signals to a preselected lower voltage in a first comparator;

providing an output signal from said first comparator when the voltage of said signals is above said preselected lower voltage;

comparing voltage of said signals to a preselected higher voltage in a second comparator;

providing an output signal from said second comparator when the voltage of said signals is below said preselected higher voltage;

providing a pulse from an AND circuit operably coupled to said first and second comparators upon said AND circuit simultaneously receiving said output signals from said comparators, said pulse having a pulse length corresponding to the elapsed time said signals are within a voltage window bounded by said lower and higher voltages; and integrating said pulse provided by said AND circuit in an integrator to provide an output voltage proportional to said elapsed time said signals are within said voltage window.

7. A method according to claim 6 further including a step of analyzing a known input signal as a calibration of said comparators and said integrator.

8. A method according to claim 7 in which said known input signal is a Gaussian signal.

9. A method according to claim 8 further including steps of:

analyzing unknown input signals by shifting said voltage window over a desired voltage range, each voltage window having a middle voltage point; and plotting said output voltage versus said middle voltage point for each voltage window examined.

10. A method according to claim 9 further including the step of:

comparing said plot to a theroretically derived probability density distribution to determine the magnitude of deviation of said plot from said theoretically derived probability density function.

* * * * *